US010372853B2

(12) United States Patent
Douskey et al.

(10) Patent No.: US 10,372,853 B2
(45) Date of Patent: Aug. 6, 2019

(54) IMPLEMENTING ENHANCED DIAGNOSTICS WITH INTELLIGENT PATTERN COMBINATION IN AUTOMATIC TEST PATTERN GENERATION (ATPG)

(71) Applicant: International Business Machines Corporation, Armonk, NY (US)

(72) Inventors: Steven M. Douskey, Rochester, MN (US); Michael J. Hamilton, Rochester, MN (US); Amanda R. Kaufer, Rochester, MN (US); Phillip A. Senum, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 15/464,031

(22) Filed: Mar. 20, 2017

(65) Prior Publication Data

US 2018/0267102 A1    Sep. 20, 2018

(51) Int. Cl.
*G01R 31/28* (2006.01)
*G06F 17/50* (2006.01)
(52) U.S. Cl.
CPC .................. *G06F 17/504* (2013.01)
(58) Field of Classification Search
CPC .......... G01R 31/31703; G01R 31/3177; G01R 31/318314; G01R 31/31835; G01R 31/318342; G01R 31/318547; G01R 31/31813; G01R 31/318307; G01R 31/318385; G06F 11/263; G06F 11/2252; G06F 11/261; G06F 11/27; G06F 2201/83; G06F 17/504
See application file for complete search history.

(56) References Cited

U.S. PATENT DOCUMENTS 6,804,803 B2 * 10/2004 Barnhart ............... G06F 11/263
  714/738
10,024,910 B2 * 7/2018 Kusko .............. G01R 31/31703
(Continued)

FOREIGN PATENT DOCUMENTS

EP     1475644 A1    11/2004
WO  WO2004107402 A2  12/2004
WO  WO2008013340 A1   1/2008

OTHER PUBLICATIONS

Parthasarathy G, et al; "Combining ATPG and symbolic simulation for efficient validation of embedded array systems." Proceedings. International 2002 (pp. 203-212). IEEE.
(Continued)

*Primary Examiner* — Guerrier Merant
(74) *Attorney, Agent, or Firm* — Joan Pennington

(57) ABSTRACT

A method and circuit for implementing enhanced diagnostics with intelligent pattern combination in automatic test pattern generation (ATPG), and a design structure on which the subject circuit resides are provided. A random fault is selected in the design. A test pattern is generated and applied the test pattern to a design under test to test the selected random fault. The test is re-simulated to determine faults that are covered by the applied test pattern. A next iteration of test pattern generation includes selecting a fault that is based upon the previous test pattern generation for generating new test patterns.

18 Claims, 6 Drawing Sheets

(56) References Cited

U.S. PATENT DOCUMENTS

| | | | |
|---|---|---|---|
| 2002/0147559 A1* | 10/2002 | Barnhart | G06F 11/263 |
| | | | 702/117 |
| 2005/0240887 A1* | 10/2005 | Rajski | G01R 31/31835 |
| | | | 716/102 |
| 2006/0041808 A1 | 2/2006 | Yamamura | |
| 2006/0066338 A1 | 3/2006 | Rajski et al. | |
| 2007/0168816 A1 | 7/2007 | Hiraide et al. | |
| 2015/0135030 A1 | 5/2015 | Zou et al. | |

OTHER PUBLICATIONS

Machouat A, et al;"Scan-based ATPG diagnostic and optical techniques combination: A new approach to improve accuracy of defect isolation in functional logic failure"2008 IEEE.

* cited by examiner

IMPLEMENTING ENHANCED DIAGNOSTICS WITH INTELLIGENT PATTERN COMBINATION IN AUTOMATIC TEST PATTERN GENERATION (ATPG)

FIELD OF THE INVENTION

The present invention relates generally to the data processing field, and more particularly, relates to a method and circuit for implementing enhanced diagnostics with intelligent pattern combination in automatic test pattern generation (ATPG), and a design structure on which the subject circuit resides.

DESCRIPTION OF THE RELATED ART

As Application Specific Integrated Circuit (ASIC) and Processor chips continue to get larger, test data volume and test time naturally increase as well. It continually becomes even more important to increase test efficiency.

Automated Test Pattern Generation, or ATPG, is the standard methodology to generate test patterns for ASIC and processor designs. ATPG can be conceptualized as two independent steps. First, generate patterns; second, simulate those patterns and determine what faults are covered. Afterward, patterns are combined and selected in such a way to maximize overall test coverage while minimizing pattern count. However, the method of generating new patterns is generally done based on previous patterns fault elimination, but independently of patterns themselves that have already been generated.

A need exists for an effective mechanism for implementing enhanced diagnostics with intelligent pattern combination in automatic test pattern generation (ATPG). It is desirable to generate new ATPG patterns that combine well with already-generated patterns in an attempt to maximize fault coverage per pattern.

SUMMARY OF THE INVENTION

Principal aspects of the present invention are to provide a method and circuit for implementing enhanced diagnostics with intelligent pattern combination in automatic test pattern generation (ATPG), and a design structure on which the subject circuit resides. Other important aspects of the present invention are to provide such method, circuit and design structure substantially without negative effects and that overcome many of the disadvantages of prior art arrangements.

In brief, a method and circuit for implementing enhanced diagnostics with intelligent pattern combination in ATPG, and a design structure on which the subject circuit resides are provided. A random fault is selected in the design. A test pattern is generated and applied the test pattern to a design under test to test the selected random fault. The test is re-simulated to determine faults that are covered by the applied test pattern. A next iteration of test pattern generation includes selecting a fault that is based upon the previous test pattern generation for generating new test patterns.

In accordance with features of the invention, in the next iterations of test pattern generation where selecting the fault that is based upon the previous test pattern generation for generating new test patterns include selecting a fault which is already controllable by the current pattern, or has not been stimulated to a value at all yet, that is to say, a fault that is not blocked from testing by the current pattern. Using this selected fault, the process of generating test patterns is repeated.

In accordance with features of the invention, in a case where a contradiction occurs where targeting the fault in question is not fully possible with the current pattern, as values at the current control or observe points may change. If the patterns are compatible, they are combined and re-simulated as before, then another fault is picked. If the patterns are not compatible and the decision is made to try again, another non-blocked fault is picked and the process is started over again. This try again condition, in practice, uses an iteration counter that aborts after too many unsuccessful attempts to add another fault to the current pattern.

In accordance with features of the invention, a stop condition is based on either overall test coverage or on test coverage per pattern.

In accordance with features of the invention, instead of selecting a random fault in the design to target at each iteration, a fault is picked that is compatible with the pattern that has already been generated. In this way, the chosen fault will not create a pattern that is definitely incompatible with the current pattern under evaluation.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing enhanced diagnostics with intelligent pattern combination in automatic test pattern generation (ATPG), and a design structure on which the subject circuit resides are provided.

Figure 1:
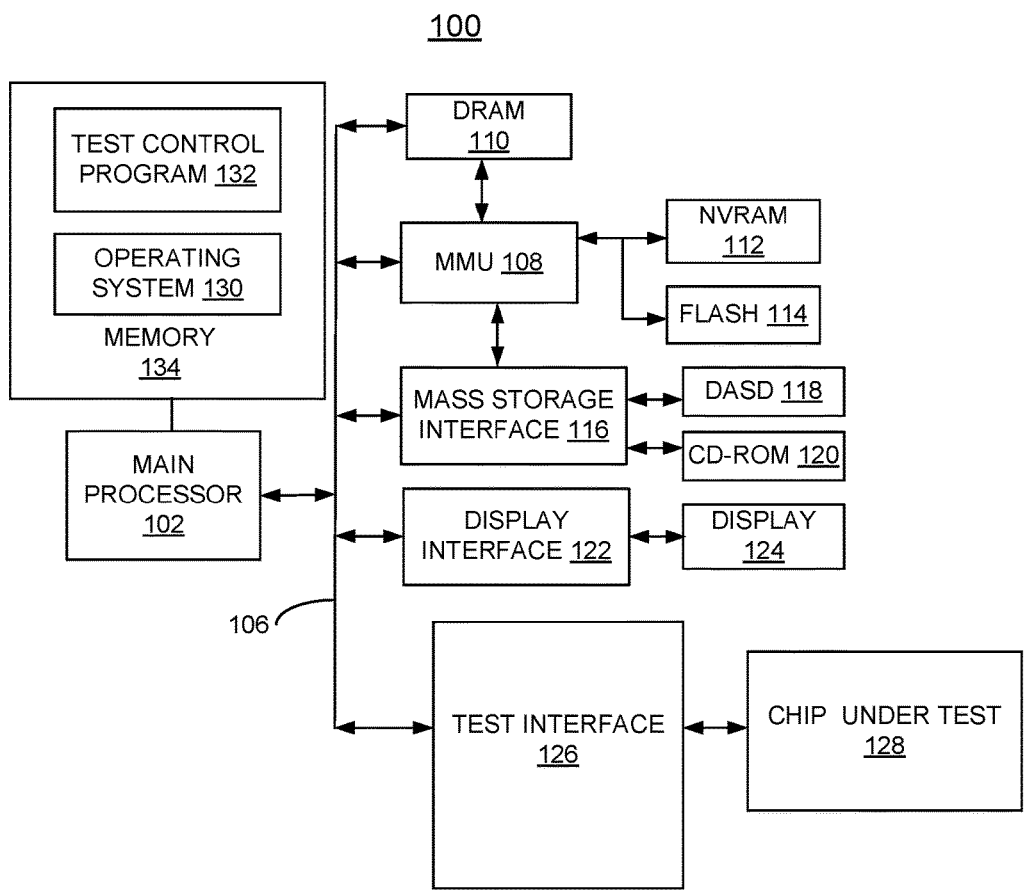
FIG. 1 is a block diagram representation illustrating an exemplary computer test system for implementing enhanced diagnostics with intelligent pattern combination in automatic test pattern generation (ATPG) in accordance with preferred embodiments.
Figure 2:
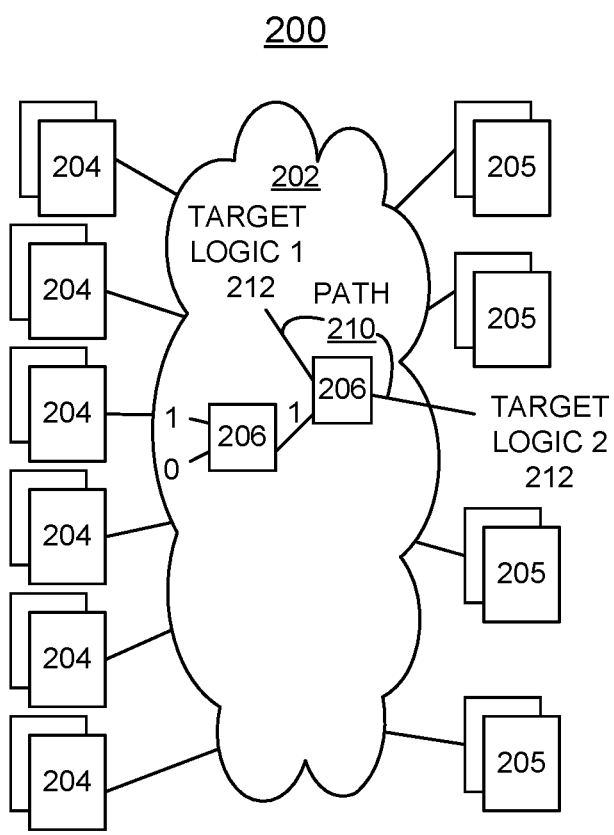
FIG. 2 is a schematic representation of an example circuit for implementing enhanced diagnostics with intelligent pattern combination in automatic test pattern generation (ATPG) in accordance with preferred embodiments.

Having reference now to the drawings, in FIGS. 1, and 2, there is shown an example computer test system for implementing enhanced diagnostics with intelligent pattern combination in ATPG generally designated by the reference character 100 and an example circuit for implementing enhanced diagnostics with intelligent pattern combination in ATPG generally designated by the reference character 200 in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 connected to a display 124, and a test interface 126 coupled to the system bus 106. An integrated circuit device or chip under test 128 is coupled to the test interface 126. Computer system 100 includes an operating system 130, and a test control program 132 of the preferred embodiment resident in a memory 134. The test interface 126 provides selective control by the test control program 132 for example operations as illustrated and described with respect to FIG. 4.

Computer test system 100 together with circuit 200 implements intelligent pattern combination in ATPG. As shown in FIG. 2, circuit 200 includes a cloud 202 of logic bounded by a plurality of latch elements 204. Items inside of the cloud 202 includes two logic gates 206. A pattern has already been generated to target a fault inside of the cloud of logic 202; however, this already-generated pattern does not block any logic on a path 210 marked with target logic 1, 212, and target logic 2, 212. Faults along that path 210 make good targets for the next test to be generated with the intelligent pattern combination in ATPG.

Computer test system 100 is shown in simplified form sufficient for understanding the present invention. The illustrated computer test system 100 is not intended to imply architectural or functional limitations. The present invention can be used with various hardware implementations and systems and various other internal hardware devices, for example, multiple main processors.

Figure 3:
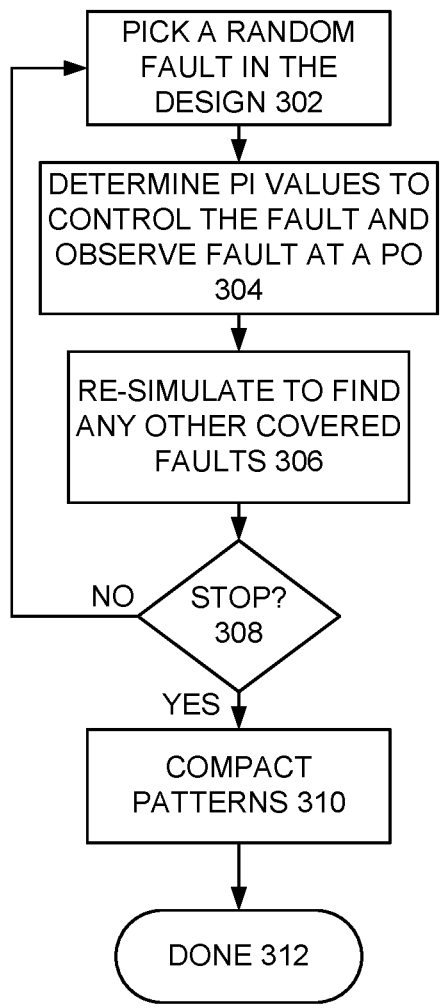
FIG. 3 is prior art flow chart illustrating a conventional automatic test pattern generation (ATPG) procedure.

FIG. 3 is prior art flow chart illustrating a conventional automatic test pattern generation (ATPG) procedure. The ATPG procedure begins by picking a random fault in the design to target shown at block 302. Next as shown at block 304, a set of Primary Input stimulation values (or, in the case of a latch-bound block of logic, latch inputs or a combination of latches and Primary Inputs) are chosen; these values stimulate the net at the fault location to a value and set up downstream logic to propagate that net's value to an observable point. The value at any downstream Primary Outputs or output latches is also noted and added to the pattern. Afterward, the pattern is re-simulated to find any other faults that can be covered by that pattern as shown at block 306. Checking for a stop condition is performed as shown at decision block 308. The stop condition can vary based on many criteria. Usually, one of three criteria is used: either the overall fault coverage has reached the user-specified coverage, the test data volume limit has been reached, or the addition of any new patterns does not yield a significant increase in fault coverage. After a stop condition is identified, the patterns are compacted as shown in block 310. At block 310, patterns are analyzed, together with their care and don't-care locations, and compatible patterns (those that share care bits or those that have complementary care and don't-care bits) are combined into a minimum set of patterns.

In accordance with features of the invention, a fault is picked that is compatible with the pattern that has already been generated. In this way, the chosen fault will not create a pattern that is definitely incompatible with the current pattern under evaluation.

Figure 4:
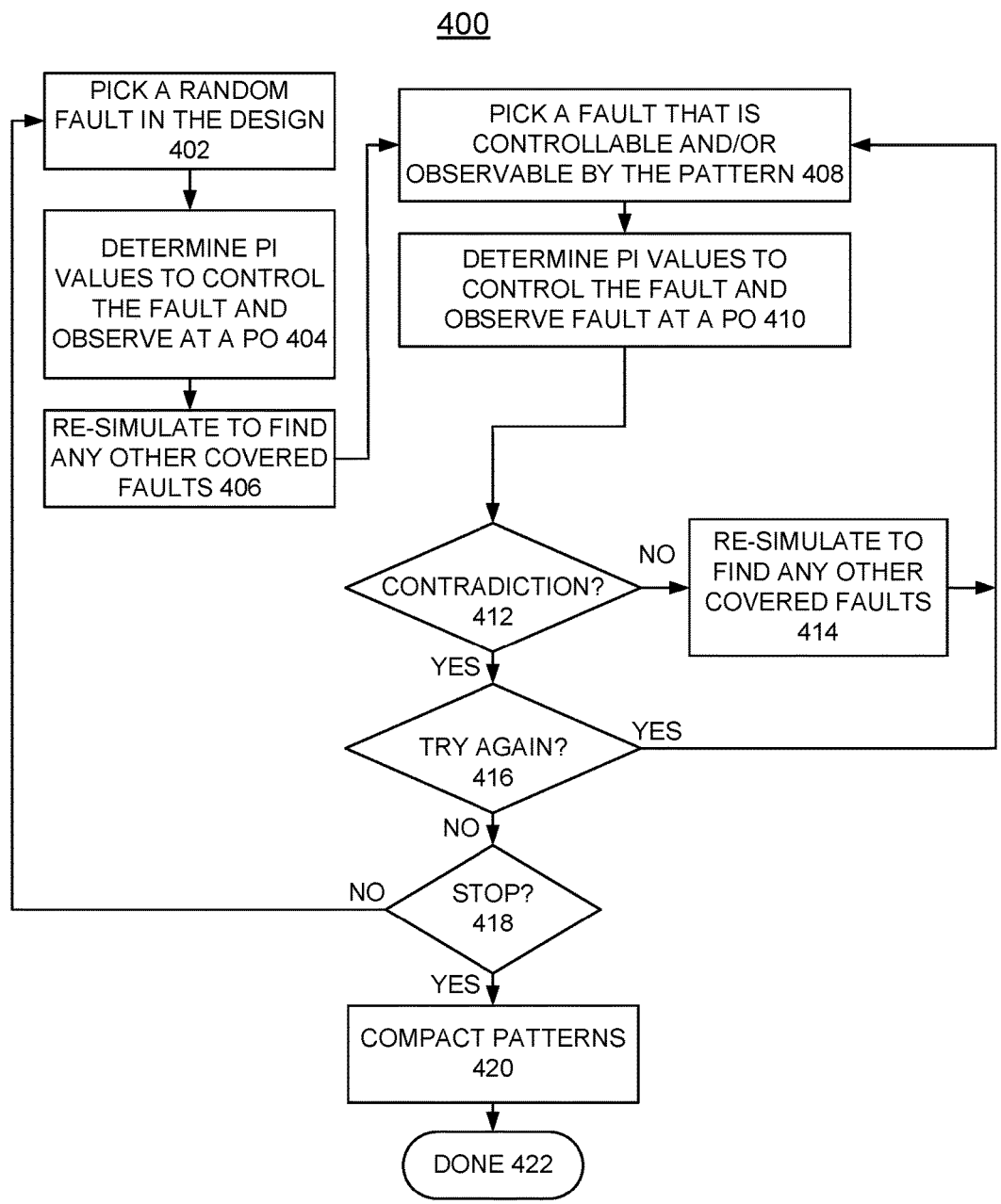
FIG. 4 is a flow chart illustrating example operations for implementing enhanced diagnostics with intelligent pattern combination in automatic test pattern generation (ATPG) in accordance with preferred embodiments.

Referring now to FIG. 4 there is shown a flow chart illustrating example operations for implementing enhanced diagnostics with intelligent pattern combination in automatic test pattern generation (ATPG) in accordance with preferred embodiments. The new method of the invention is started in the same way as before: pick a random fault in the design at a block 402, generate a pattern to test that fault, determine a set of Primary Input (PI) stimulation values or latch inputs are chosen; these values stimulate the net at the fault location to a value and set up downstream logic to propagate that net's value to an observable point (latch or Primary Output (PO)) at a block 404, then re-simulate to find all faults covered by the pattern at a block 406. As indicated at a block 408, a fault is picked that is controllable and/or observable by the pattern. Instead of picking another random fault in the design, at block 408 a fault is found which is already controllable by the current pattern, or has not been stimulated to a value at all yet (that is to say, a fault that is not blocked from testing by the current pattern). Using this fault, and the current pattern, the process of generating test patterns is repeated. As indicated at a block 410, PI values are determined to control the fault and observe the fault at a PO or a latch.

As indicated at a decision block 412, checking for contradiction is performed. In a case where a contradiction occurs, that is, where targeting the fault in question may not be fully possible with the current pattern, as values at the current control or observe points may change. If the patterns are compatible, the patterns are combined and re-simulated as before in block 414, then another fault is picked that is controllable by this new combined pattern at block 408.

As indicated at a decision block 416, checking for a try again condition is performed. When the decision is made to try again, another non-blocked fault is picked and the process is started over again. The try again condition, in practice, includes an iteration counter that aborts after too many unsuccessful attempts to add another fault to the current pattern.

As indicated at a decision block 418, checking for a stop condition is performed. The stop condition is the same stop condition as in the prior art process of FIG. 3. The stop condition is based on either overall test coverage, data volume limit, or on test coverage per pattern. As indicated at a block 420, a compact patterns step is left here for completeness, but since the patterns generated are much more fault-dense than in the prior art process of FIG. 3, it is unlikely that post-processing compaction would have as great of an impact as before.

Figure 5:
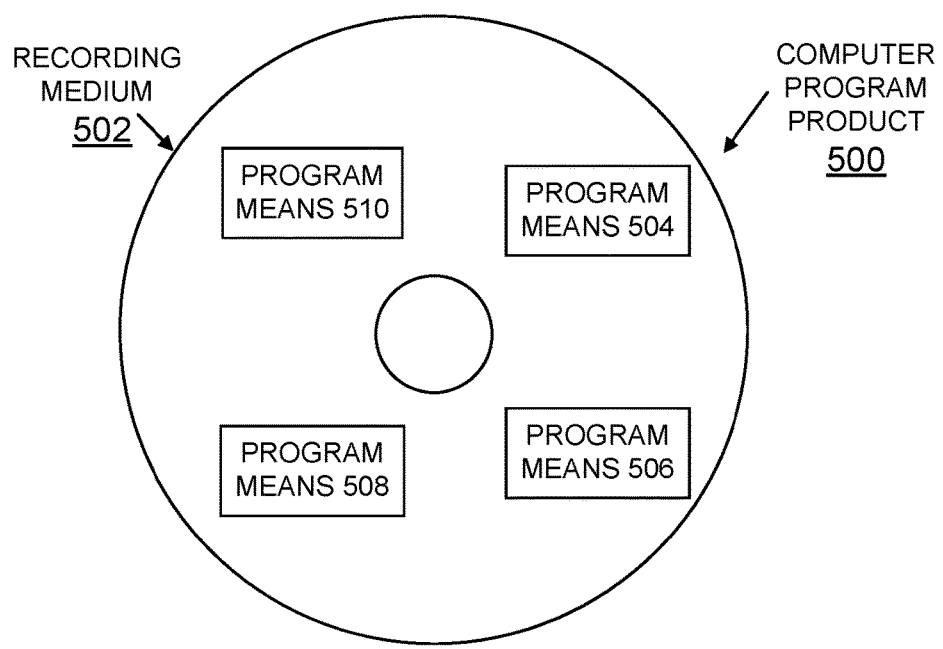
FIG. 5 is a block diagram illustrating a computer program product in accordance with the preferred embodiments.

Referring now to FIG. 5, an article of manufacture or a computer program product 500 of the invention is illustrated. The computer program product 500 includes a recording medium 502, such as, a floppy disk, a high capacity read only memory in the form of an optically read compact disk or CD-ROM, a tape, or another similar computer program product. Recording medium 502 stores program means 504, 506, 508, and 510 on the medium 502 for carrying out the methods for implementing enhanced diagnostics with intelligent pattern combination in automatic test pattern generation (ATPG) of the preferred embodiments in the system 100 of FIG. 1.

A sequence of program instructions or a logical assembly of one or more interrelated modules defined by the recorded program means 504, 506, 508, and 510, direct the computer system 500 for implementing enhanced diagnostics with intelligent pattern combination in ATPG of the preferred embodiments.

Figure 6:
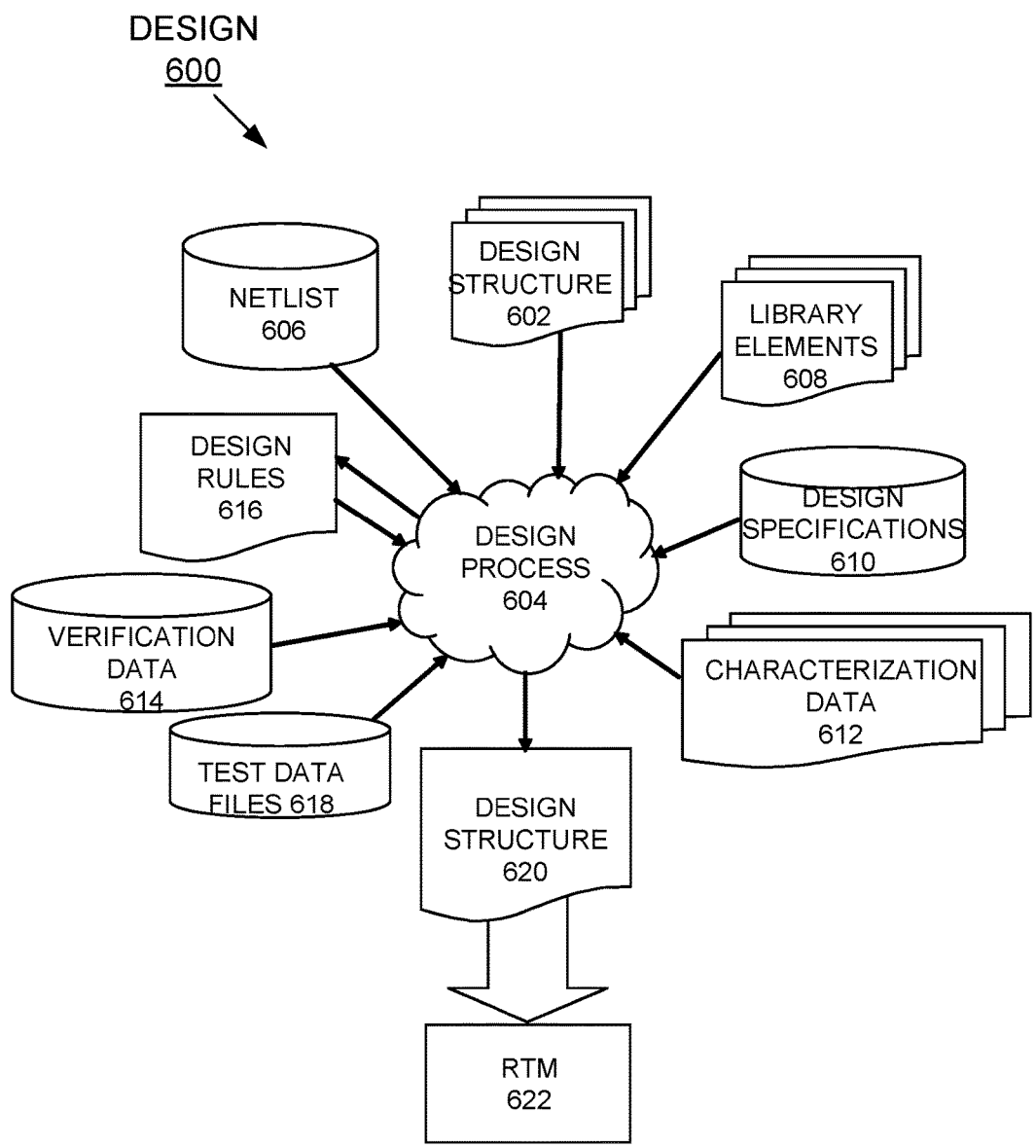
FIG. 6 is a flow diagram of a design process used in semiconductor design, manufacturing, and/or test.

FIG. 6 shows a block diagram of an example design flow 600. Design flow 600 may vary depending on the type of IC being designed. For example, a design flow 600 for building an application specific IC (ASIC) may differ from a design flow 600 for designing a standard component. Design structure 602 is preferably an input to a design process 604 and may come from an IP provider, a core developer, or other design company or may be generated by the operator of the design flow, or from other sources. Design structure 602 comprises circuits 100, 200 in the form of schematics or HDL, a hardware-description language, for example, Verilog, VHDL, C, and the like. Design structure 602 may be contained on one or more machine readable medium. For example, design structure 602 may be a text file or a graphical representation of circuits 100, 200. Design process 604 preferably synthesizes, or translates, circuits 100, 200 into a netlist 606, where netlist 606 is, for example, a list of wires, transistors, logic gates, control circuits, I/O, models, etc. that describes the connections to other elements and circuits in an integrated circuit design and recorded on at least one of machine readable medium. This may be an iterative process in which netlist 606 is resynthesized one or more times depending on design specifications and parameters for the circuit.

Design process 604 may include using a variety of inputs; for example, inputs from library elements 608 which may house a set of commonly used elements, circuits, and devices, including models, layouts, and symbolic representations, for a given manufacturing technology, such as different technology nodes, 32 nm, 45 nm, 60 nm, and the like, design specifications 610, characterization data 612, verification data 614, design rules 616, and test data files 618, which may include test patterns and other testing information. Design process 604 may further include, for example, standard circuit design processes such as timing analysis, verification, design rule checking, place and route operations, and the like. One of ordinary skill in the art of integrated circuit design can appreciate the extent of possible electronic design automation tools and applications used in design process 604 without deviating from the scope and spirit of the invention. The design structure of the invention is not limited to any specific design flow.

Design process 604 preferably translates an embodiment of the invention as shown in FIGS. 1, and 2 along with any additional integrated circuit design or data (if applicable), into a second design structure 620. Design structure 620 resides on a storage medium in a data format used for the exchange of layout data of integrated circuits, for example, information stored in a GDSII (GDS2), GL1, OASIS, or any other suitable format for storing such design structures. Design structure 620 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, and 2. Design structure 620 may then proceed to a stage 622 where, for example, design structure 620 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A computer test system and circuit for implementing enhanced diagnostics of a design under test with intelligent pattern combination in automatic test pattern generation (ATPG) comprising:
   a processor;
   a test control program, said processor using said test control program for performing the steps of:
   selecting a random fault in the design;
   generating a test pattern and applying the test pattern to the design under test to test the selected random fault;
   re-simulating the test pattern to determine faults covered by the applied test pattern;
   selecting a fault based upon the applied test pattern to the design under test for generating a new test pattern for next iterations of test pattern generation including identifying a contradiction, where as values at one of a current control point and a current observe point change causes targeting the selected fault to be not fully possible with the applied pattern, and repeating with selecting another fault based upon the applied test pattern for generating the new test pattern; and
   performing diagnostics of the design under test using the generated new test pattern for next iterations of test pattern generation with intelligent pattern combination in automatic test pattern generation (ATPG).

2. The computer test system and circuit as recited in claim 1 wherein selecting the fault based upon the applied test pattern to the design under test includes selecting a fault not being blocked and observable by the applied test pattern.

3. The computer test system and circuit as recited in claim 1 wherein selecting the fault based upon the applied test pattern includes selecting a fault not being blocked from testing by the applied test pattern.

4. The computer test system and circuit as recited in claim 1 includes repeating the process of generating a test pattern using the selected fault based upon the applied test pattern to the design under test.

5. The computer test system and circuit as recited in claim 1 wherein selecting the fault based upon the applied test pattern to the design under test includes identifying compatible patterns, the identified compatible patterns including patterns sharing care bits, and patterns having complementary care and don't-care bits, combining and re-simulating the identified compatible patterns, and selecting another fault.

6. The computer test system and circuit as recited in claim 5 wherein selecting the fault based upon the applied test pattern to the design under test includes identifying patterns not compatible, and selecting another non-blocked fault.

7. The computer test system and circuit as recited in claim 6 includes using an iteration counter, and aborting fault selection after a set count value of unsuccessful attempts to add another fault.

8. The computer test system and circuit as recited in claim 1 wherein selecting a fault based upon the applied test pattern to the design under test includes selecting a fault identified as not being blocked for testing with the applied test pattern.

9. The computer test system and circuit as recited in claim 8 wherein the selected fault avoids creating a pattern that is definitely incompatible with the applied test pattern to the design under test.

10. A method for implementing enhanced diagnostics with intelligent pattern combination in automatic test pattern generation (ATPG) in a test computer comprising:
   selecting a random fault in the design;
   generating a test pattern and applying the test pattern to the design under test to test the selected random fault;
   re-simulating the test pattern to determine faults covered by the applied test pattern to the design under test;
   selecting a fault based upon the applied test pattern to the design under test for generating a new test pattern for next iterations of test pattern generation including identifying a contradiction, where as values at one of a current control point and a current observe point change causes targeting the selected fault to be not fully possible with the applied pattern, and repeating with selecting another fault based upon the applied test pattern for generating the new test pattern; and
   performing diagnostics of the design under test using the generated new test pattern for next iterations of test pattern generation with intelligent pattern combination in automatic test pattern generation (ATPG).

11. The method of claim 10, wherein selecting the fault based upon the applied test pattern to the design under test includes selecting a fault not being blocked and observable by the applied test pattern.

12. The method of claim 10, wherein selecting the fault based upon the applied test pattern to the design under test includes selecting a fault not being blocked from testing by the applied test pattern.

13. The method of claim 10, includes repeating the process of generating a test pattern using the selected fault based upon the applied test pattern to the design under test.

14. The method of claim 10, wherein selecting the fault based upon the applied test pattern to the design under test includes identifying compatible patterns, the identified compatible patterns including patterns sharing care bits, and patterns having complementary care and don't-care bits, combining and re-simulating the identified compatible patterns, and selecting another fault.

15. The method of claim 14, wherein selecting the fault based upon the applied test pattern to the design under test includes identifying patterns not compatible, and selecting another non-blocked fault.

16. The method of claim 10, includes using an iteration counter, and aborting fault selection after a set count value of unsuccessful attempts to add another fault.

17. The method of claim 10, wherein selecting a fault based upon the applied test pattern to the design under test includes selecting a fault identified as not being blocked for testing with the applied test pattern.

18. The method of claim 17, wherein the selected fault avoids creating a pattern that is definitely blocked for testing with the applied test pattern.

* * * * *